United States Patent
Manouvrier

(10) Patent No.: US 9,239,506 B2
(45) Date of Patent: Jan. 19, 2016

(54) DUAL STATIC ELECTRO-OPTICAL PHASE SHIFTER HAVING TWO CONTROL TERMINALS

(71) Applicant: STMICROELECTRONICS SA, Montrouge (FR)

(72) Inventor: Jean-Robert Manouvrier, Echirolles (FR)

(*) Notice: Subject to any disclaimer, the term of this patent is extended or adjusted under 35 U.S.C. 154(b) by 112 days.

(21) Appl. No.: 14/271,723

(22) Filed: May 7, 2014

(65) Prior Publication Data
US 2014/0341499 A1   Nov. 20, 2014

(30) Foreign Application Priority Data

May 17, 2013 (FR) .................... 13 54462

(51) Int. Cl.
| | |
|---|---|
| *G02F 1/035* | (2006.01) |
| *G02F 1/225* | (2006.01) |
| *G02F 1/015* | (2006.01) |
| *G02F 1/025* | (2006.01) |
| *H01L 33/00* | (2010.01) |
| *G02F 1/21* | (2006.01) |

(52) U.S. Cl.
CPC .............. *G02F 1/2257* (2013.01); *G02F 1/015* (2013.01); *G02F 1/025* (2013.01); *H01L 33/0012* (2013.01); *G02F 2001/212* (2013.01); *G02F 2203/20* (2013.01)

(58) Field of Classification Search
CPC ......... G02F 1/015; G02F 1/025; G02F 1/225; G02F 1/2257; G02F 2001/212; G02F 2203/20; H04B 10/548
See application file for complete search history.

(56) References Cited

U.S. PATENT DOCUMENTS

| | | | |
|---|---|---|---|
| 6,801,702 B2* | 10/2004 | Day ........................ | G02F 1/025 385/129 |
| 9,104,047 B2* | 8/2015 | Manouvrier ............ | G02F 1/025 |
| 2005/0271315 A1 | 12/2005 | Gan et al. | |
| 2009/0263078 A1* | 10/2009 | Hosomi ............. | G02B 6/12004 385/14 |
| 2010/0158426 A1 | 6/2010 | Manipatruni et al. | |
| 2014/0341498 A1* | 11/2014 | Manouvrier .......... | G02F 1/2257 385/3 |
| 2014/0341499 A1* | 11/2014 | Manouvrier .......... | G02F 1/2257 385/3 |
| 2014/0376852 A1* | 12/2014 | Manouvrier ............ | G02F 1/025 385/3 |

OTHER PUBLICATIONS

Li et al., "Low Driving-Voltage Optical Modulator Based on Carrier Depletion in Silicon with Periodically Interleaved P-N Junctions," IEEE, Sep. 17, 2008, pp. 13-15.

(Continued)

*Primary Examiner* — Rhonda Peace
(74) *Attorney, Agent, or Firm* — Allen, Dyer, Doppelt, Milbrath & Gilchrist, P.A. Attorneys at Law

(57) ABSTRACT

A semiconductor electro-optical phase shifter comprises a central zone (I1, I2) having a minimum doping level; first and second lateral zones (N+, P+) flanking the central zone along a first axis, respectively N and P-doped, so as to form a P-I-N junction between the first and second lateral zones. The central zone comprises first and second optical action zones (I1, I2) separated along the first axis. The second lateral zone is doped discontinuously along a second axis perpendicular to the first axis. Two electrical control terminals (A, C) are provided, one in contact with the first lateral zone, and the other in contact with doped portions of the second lateral zone.

12 Claims, 3 Drawing Sheets

(56) References Cited

OTHER PUBLICATIONS

Fischer et al., "Optical Waveguide Switches in Silicon Based on Ge-Indiffused Waveguides," IEEE Photonics Technology Letters, vol. 6, No. 8, Aug. 1, 1994, pp. 978-980.

Akiyama et al., 12.5 Gb/s Operation with 0.29-V.cm V[pi]L Using Silicon Mach-Zehnder Modulator Based-on Forward-Biased Pin Diode, Optics Express, vol. 20, No. 3, Jan. 30, 2012, pp. 2911-2923.

Manouvrier, U.S. Appl. No. 14/271,641, filed May 7, 2014.

* cited by examiner (Prior Art)

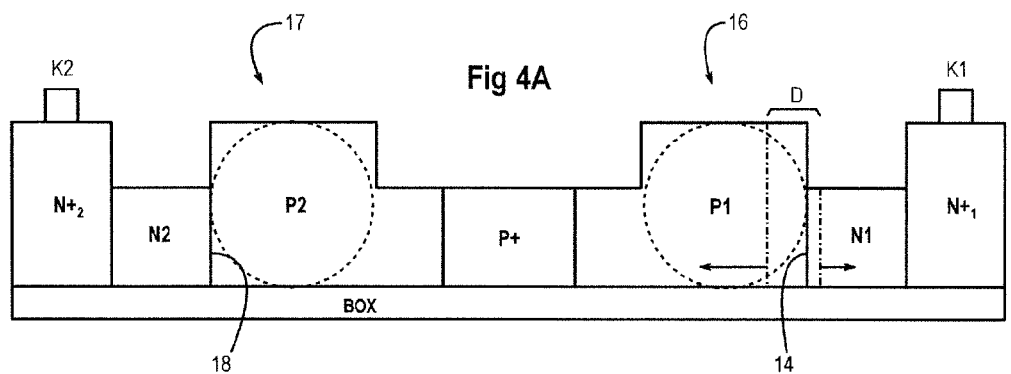
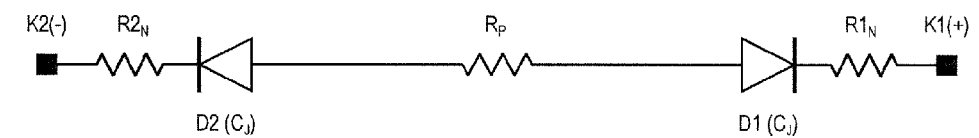
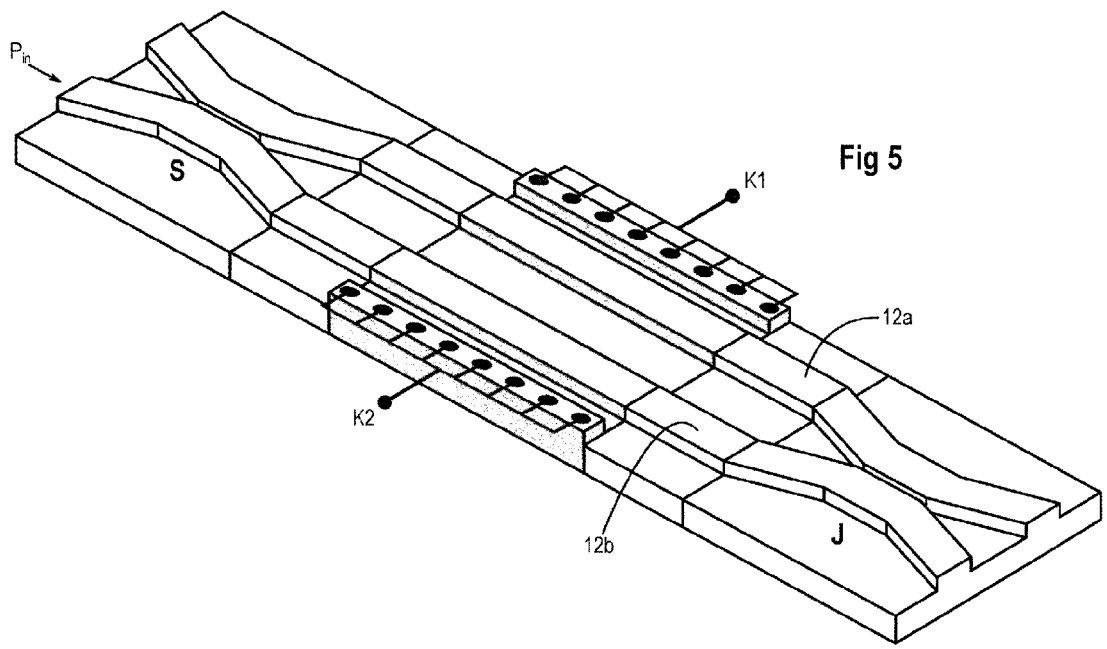

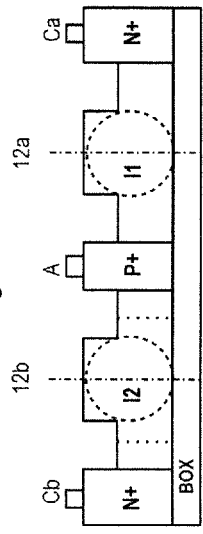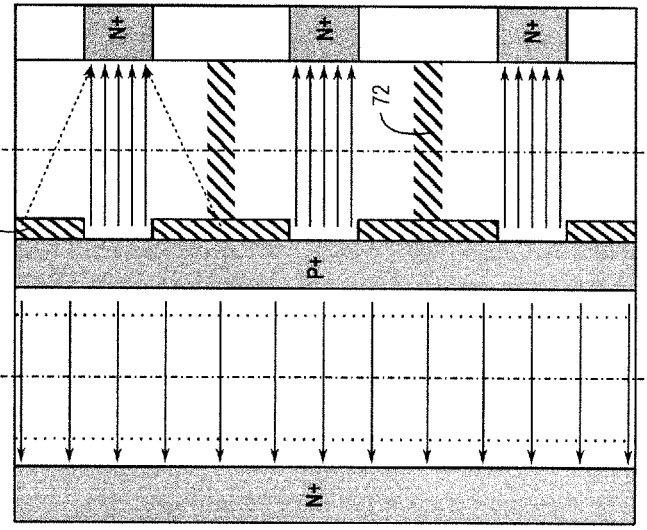
Fig 7A
Fig 7B
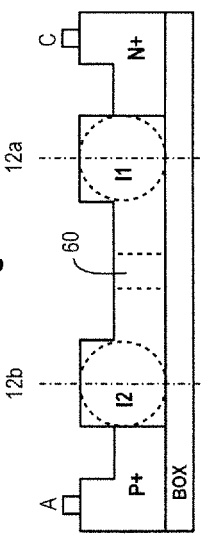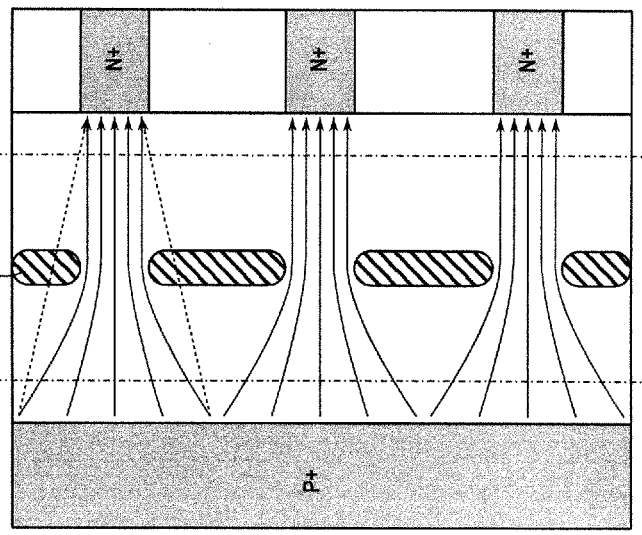
Fig 6A
Fig 6B

DUAL STATIC ELECTRO-OPTICAL PHASE SHIFTER HAVING TWO CONTROL TERMINALS

TECHNICAL FIELD

The present disclosure relates to semiconductor optical modulators and, in particular, to electro-optical phase shifters used in such modulators.

BACKGROUND

FIG. 1 shows an optical modulator based upon the Mach-Zehnder interferometer principle, commonly referred to as a MZI modulator. The modulator includes an optical waveguide receiving an optical signal with power $P_{in}$, which is divided into two branches 12a and 12b at a point S. The two branches come together again at a point J. Each branch carries half of the original optical power.

Each branch comprises a static electro-optical phase shifter (SPS), i.e. (SPSa and SPSb), and a dynamic electro-optical phase shifter (DPS), i.e. (DPSa and DPSb). The static phase shifters SPS are used to define an initial phase difference φ0 between the two optical waveguide branches. They are controlled by respective bias signals IBa and IBb. The dynamic phase shifters DPS are used to perform a differential modulation around the initial conditions defined by the SPS phase shifters. They are controlled by respective modulation signals M and M/ varying in phase opposition. The waves from both branches of the modulator are added at point J. The resulting wave has a power of $P_{in} \cdot \cos^2(\Delta\phi/2)$, neglecting the optical losses, where $\Delta\phi$ is the instantaneous phase difference between the waves of the two branches.

FIG. 2 shows the waveguide branches 12a and 12b incorporating phase shifters SPS and DPS, shown in gray. As shown, the waveguides are formed in transparent islands, made of intrinsic semiconductor material, having an inverted "T" section, the central portion of which transmits the optical beam. The phase shifters are configured to replace waveguide segments and have the same inverted "T" cross-section. The edges of the phase shifters bear electrical contacts used to control the phase shifters—they usually extend above the plane of the waveguide, as shown, to reach the metal levels.

FIG. 3A shows a DPS phase shifter referred to as a high-speed phase modulator (HSPM). The cross-section plane is perpendicular to the axis of the optical waveguide. A circle indicated with a dashed line, at the thicker central region, represents the area crossed by the optical beam. The phase shifter comprises a semiconductor structure, typically silicon, forming a P-N junction 14 in a plane parallel to the axis of the waveguide, and offset relative thereto. The junction 14 is shown, for example, at the right side face of the waveguide. A P-doped zone extends to the left of junction 14, which has a cross-section conforming to the cross-section of the waveguide, namely elevated in the center and lower at the edge. Zone P ends at its left by a P+ doped raised area, bearing an anode contact A. An N-doped zone extends to the right of the junction 14, conforming to the cross section of the waveguide. The zone N ends to the right by an N+ doped raised area, bearing a cathode contact C. The structure of the phase shifter may be formed on an insulating substrate, for example, a buried oxide layer BOX.

For controlling the phase shifter of FIG. 3A, a voltage is applied between the anode and cathode contacts A, C, which reverse biases the junction 14 (the '+' on the cathode and the '−' on the anode). This configuration causes a displacement of electrons e from the N region to the cathode and of holes h from the P region to the anode, and the creation of a depletion region D in the vicinity of the junction 14. The carrier concentration is thus based upon the magnitude of the bias voltage in the area crossed by the optical beam, which results in a corresponding modification of the refractive index of this area.

FIG. 3B shows a P-I-N junction SPS phase shifter. The P and N-doped central regions of the structure of FIG. 3A have been replaced by a single intrinsic semiconductor zone I, in practice, a zone having a minimal P doping level. For controlling this phase shifter, a current is applied between the anode and cathode contacts A and C, which forward biases the junction (the '−' on the cathode and the '+' on the anode). A current is established between the anode and the cathode, thereby causing the injection of carriers in the intrinsic zone I (holes h from the P+ region to zone I and electrons e from the N+ region to zone I). The carrier concentration, i.e. the refractive index, is thus changed as a function of the current in the area crossed by the optical beam. PIN phase shifters have a slow response compared to HSPM shifters, but they offer a wider range of adjustment, which is why they are used to set the quiescent conditions of the modulator.

An MZI modulator may achieve in theory a modulation frequency of several tens of gigahertz. However, this frequency may be affected by the matching between shifters DPSa and DPSb, and the matching between the control signals M and M/. As shown in FIG. 2, the shifters DPSa and DPSb may be inserted into separate waveguide branches. The fabrication constraints for these branches may impose a gap between the branches of the order of a millimeter, which is a considerable distance at the scale of the integration technologies used for the circuits producing the control signals. As a result, it may be difficult to achieve the desired optical and electrical matching.

SUMMARY

Generally, a dynamic semiconductor electro-optical phase shifter may comprise a first optical action zone in the vicinity of a first P-N junction formed between an intermediate zone having a first conductivity type, and a first lateral zone having a second conductivity type, and a second optical action zone in the vicinity of a second P-N junction formed between the intermediate zone and a second lateral zone on the side opposite the first lateral zone, having the second conductivity type. The phase shifter may include two electrical control terminals in contact with the first and second lateral zones, respectively. Additionally, the phase shifter may be configured to be located in two parallel optical waveguides, respectively in correspondence with the two optical action zones. The distance between the two optical action zones may be sufficient to prevent an optical coupling between the two waveguides. A differential modulation may be achieved for two optical waves originating from a same source, by applying a single modulation voltage between the two terminals of the dynamic phase shifter.

The first and second optical action zones may have a threshold (e.g. minimum) doping level, and the center of the intermediate zone and the lateral zones by the control terminals may have a high doping level. The doping level may follow an increasing gradient from the center of each of the first and second optical action zones.

One aspect is directed to a Mach-Zehnder interferometer electro-optical modulator. The Mach-Zehnder interferometer electro-optical modulator may comprise a pair of parallel optical wave guides formed in a same island of a semiconductor material, at a sufficient distance from each other to prevent optical coupling, an optical beam separating element feeding each of the waveguides from a single input beam, a dynamic phase shifter of the above type located in the pair of waveguides, such that each of the first and second optical action zones is interposed in a respective one of the waveguides, and a junction element configured to combine the two optical beams exiting the phase shifter.

Another aspect is directed to a static semiconductor electro-optical phase shifter for the modulator. The static semiconductor electro-optical phase shifter may include a central zone having a threshold (e.g. minimum) doping level, and first and second lateral zones flanking the central zone along a first axis, respectively N and P-doped so as to form a P-I-N junction between the first and second lateral zones. The central zone may comprise first and second optical action zones separated along the first axis. The second lateral zone may be doped discontinuously along a second axis perpendicular to the first axis. Two electrical control terminals may be provided, one in contact with the first lateral zone, and the other in contact with doped portions of the second lateral zone.

According to an embodiment, the static phase shifter may comprise an insulator located between the first and second optical action zones, open opposite the doped portions of the second lateral zone. According to an alternative embodiment, the static electro-optical phase shifter may comprise a first optical action zone having a threshold (e.g. minimum) doping level, and a first lateral zone and central zone flanking the first optical action zone along a first axis, doped respectively at first and second conductivity types. This is so as to form a P-I-N junction between the first lateral zone and the central zone. The static electro-optical phase shifter may comprise a second optical action zone having a threshold (e.g. minimum) doping level, and a second lateral zone flanking the second optical action zone with the central zone along the first axis, doped at the first conductivity type so as to form a P-I-N junction between the second lateral zone and the central zone.

Moreover, the static phase shifter may comprise two electrical control terminals, one in contact with the central zone and the other in contact with both the first and second lateral zones, and means or a device for establishing an imbalance between the currents flowing in the two optical action zones. The second lateral zone may be doped discontinuously along a second axis perpendicular to the first axis. The second optical action zone may be wider, along the first axis, than the first optical action zone. The static phase shifter may comprise an insulator disposed between the central zone and the second optical action zone, open opposite doped portions of the second lateral zone.

BRIEF DESCRIPTION OF THE DRAWINGS

Other advantages and features will become more clearly apparent from the following description of particular embodiments of the present disclosure provided for exemplary purposes only and represented in the appended drawings, in which:

FIG. 4A is a schematic diagram of a sectional view of an embodiment of a dual HSPM phase shifter, according to the present disclosure.

FIG. 4B is an equivalent circuit diagram of the dual phase shifter, according to the present disclosure.

FIG. 5 is a schematic diagram of an MZI modulator incorporating a dual phase shifter, according to the present disclosure.

FIGS. 6A and 6B are schematic diagrams of sectional and top views of an embodiment of a dual static phase shifter for a dual dynamic phase shifter of the type of FIG. 4A, according to the present disclosure.

FIGS. 7A and 7B are schematic diagrams of sectional and top views of another embodiment of a dual static phase shifter for a dual dynamic phase shifter of the type of FIG. 4A, according to the present disclosure.

DETAILED DESCRIPTION

FIG. 4A shows an embodiment of a dual dynamic phase shifter allowing an improved matching between the two branches of an MZI modulator. The phase shifter comprises, in a single island, two optical action zones, represented by dashed circles, for modifying the phase of two respective parallel optical beams. The control voltage of the phase shifter is unique, and its polarity selects which of the two optical action zones is used for changing the phase.

Figure 3A:
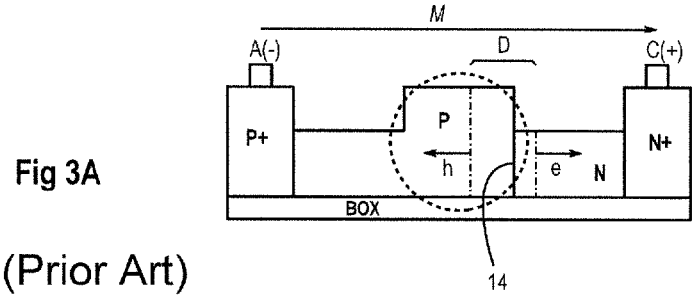
FIGS. 3A and 3B are schematic diagrams of sectional views of two types of phase shifters used in the modulator of FIG. 1.

More specifically, the phase shifter includes two HSPM structures in opposition, associated respectively with the two optical action zones. To the right of FIG. 4A, one will recognize a first HSPM structure 16, such as shown in FIG. 3A, forming a first P-N junction 14 between P and N doped zones, designated P1 and N1. The N+ zone of the structure, here designated $N+_1$, bears a first cathode contact K1. The P+ zone, instead of serving as a contact like in FIG. 3A, is a common zone between the HSPM structure 16 and a symmetrical HSPM structure 17. The HSPM structure 17 comprises zones P2, N2 and $N+_2$ that are symmetrical, respectively, to the zones P1, N1 and $N+_1$. The zones P2 and N2 define a second P-N junction 18. The zone $N+_2$ bears a second cathode contact K2.

FIG. 4B illustrates an equivalent electrical circuit diagram of the phase shifter of FIG. 4A. Junctions 14 and 18 form two diodes D1 and D2 connected anode to anode. A resistor $R_P$ between the anodes of the diodes represents the resistivity of the central area P1, P+, P2. Resistors $R1_N$ and $R2_N$ between, respectively, the cathodes of diodes D1, D2 and the contacts K1, K2, represent the resistivity of lateral zones N1, $N+_1$, and N2, $N+_2$.

The zones $N+_1$, P+ and $N+_2$ may be heavily doped to reduce resistivity, while the optical action areas may be lightly doped to reduce optical losses. To achieve a good compromise between resistivity and optical losses, the doping level of the structure may follow a gradient starting from a minimum value at each optical action zone to a maximum value at the center and edges of the structure.

FIG. 4B further illustrates a possible polarity of the modulation voltage applied to the phase shifter. Contact K1 has been shown at the "plus" of the modulation voltage, and contact K2 at the "minus". Junction 18 could be forward biased to allow current flow from contact K1 to contact K2, but junction 14 would be reverse biased and prevent current flow. In reality, this type of phase shifter is designed to operate in dynamic mode, with a modulation voltage that varies at a high frequency—the behavior of the structure of FIG. 4A should rather be considered in transient mode.

In transient mode, junctions 14 and 18 are seen as capacitors $C_J$ having a low impedance. Thus, the capacity of junction 18 allows the evacuation of holes from the P-doped areas, namely area P1, to the contact K2, so that a depletion region D is formed in the vicinity of the junction 14. The structure 16 then behaves in the same manner as that of FIG. 3A, and accordingly acts on an optical beam passing in the vicinity of junction 14. The structure 17 is in quiescent state, and acts as having a zero control voltage on an optical beam therethrough.

When the polarity is reversed between the contacts K1 and K2, it is junction 18 that is reverse biased, and the depletion zone is created in the vicinity of this junction 18. Structure 17 then behaves in the same manner as that of FIG. 3A, and acts upon the optical beam passing in the vicinity of junction 18. The structure 16 is in a quiescent state, and acts as having a zero control voltage upon the optical beam therethrough.

The phase shifter of FIG. 4A may thus act symmetrically on two parallel optical beams depending on the polarity of a single control voltage. The control voltage being unique, there is no longer a matching problem between two independent control voltages. In addition, since the two HSPM phase shifters are close to each other, a good matching is achieved between the electrical and optical characteristics.

The minimum distance between the optical action zones is determined by the optical coupling limit between the two corresponding waveguides. For silicon and a wavelength of about 1300 nm, this limit is of the order of 1.2 microns.

FIG. 5 shows an MZI modulator incorporating a dual phase shifter. The dual phase shifter is shown in gray. It is extended at both ends by intrinsic silicon islands in which are formed the two waveguide branches 12a and 12b. Metallizations used for establishing contact with the terminals K1 and K2 may be comb-shaped, as shown, to reduce parasitic inductance and capacitance. Then, the fingers of the combs lie on individual N+ zones (N+$_1$, N+$_2$), isolated from each other in the direction of the axis of the waveguides.

The modulator further comprises a separation element S at the input and a junction element J at the output, which may comprise optical couplers, for example. These couplers may be formed in the same island as the pair of waveguide branches 12a, 12b. Since the distance between the branches may be of the order of micrometers, a particularly compact modulator may be achieved. The modulator of FIG. 5 is in some embodiments supplemented by static phase shifters SPS for adjusting the quiescent phase difference between the two branches 12a and 12b. Such phase shifters could be provided in a typical manner in two separate waveguides that converge towards the two branches 12a and 12b of FIG. 5. However, it may be helpful to have a dual static phase shifter that can be assembled in the continuity of the dual dynamic phase shifter of FIG. 5. It may also be desirable that such a dual static phase shifter be controllable by a single signal to simplify the control circuit and signal routing.

Figure 3B:
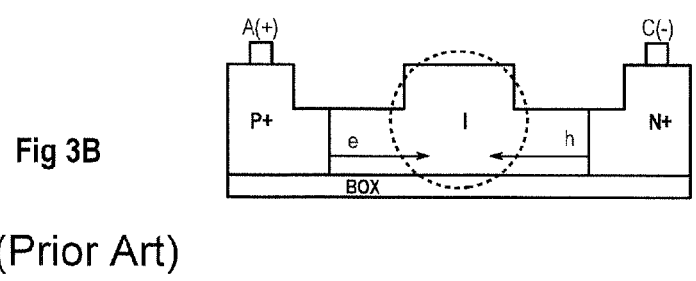

The following figures show two embodiments of dual static phase shifters that can meet these needs. FIGS. 6A and 6B show a first embodiment of a dual static phase shifter. The phase shifter is of the P-I-N junction type, similar to that of FIG. 3B. The intrinsic region, instead of comprising a central portion adapted to a single wave guide, comprises two spaced apart lateral portions I1 and I2 adapted to the two waveguide branches 12a and 12b. This dual phase shifter is controlled through a single pair of contacts A and C, corresponding to those of the typical single phase shifter. If no further design measure is taken, a control current injected between contacts A and C causes the same optical effect in both zones I1 and I2, which introduces no phase shift between the optical waves through these zones.

FIG. 6B more specifically illustrates a structure to create a phase shift between the two optical waves that increases with the single control current. One of the lateral zones, here the left zone, has a continuous doping (P+) along the axis of the waveguides, while the other lateral zone, the zone on the right, has a discontinuous doping (N+) along the same axis. Thus, the right area includes N+ doped, spaced apart spans. These spans are electrically connected to the same control terminal C, for example, by way of comb-shaped metal tracks similar to those of FIG. 5.

A current injected from the anode A to the cathode C, as shown by bundles of arrows, starts according to a uniform distribution along the P+ zone and ends by concentrating towards each span N+. Thus, the zone I2 sees a low current density, but over an effective length (along the axis of the waveguides) close to the length of the phase shifter. While the zone I1 sees a greater current density but over a short effective length. The ratio of the effective length over the current density is the same in both zones I1 and I2, yet different refractive indices are obtained in the two zones.

Indeed, it turns out that the refractive index of silicon, in zones I1 and I2, increases faster with the effective length than with the current density. Thus, when the control current increases, the refractive index of zone I2 increases faster than the index of zone I1, so that the phase delay introduced by zone I2 increases faster than the phase delay introduced by zone I1. As a result, the phase difference between the two branches of the waveguide increases with the control current.

According to experiments performed by the Applicant, with silicon and a wavelength of 1310 nm, the refractive index is proportional to $Li^{0.6}$, where L is the effective length and i the control current. Taking into account the current densities and the effective lengths L1 and L2 of zones I1 and I2, with q=L2/L1 (>1), the refractive index of the zone I2 is proportional to:

$$L_2 i^{0.6};$$

and the refractive index of zone I1 is proportional to:

$$L_1(qi)^{0.6} = L_2 q^{-1}(qi)^{0.6} = L_2 q^{-0.4} i^{0.6}.$$

The phase difference introduced between the two branches is thus proportional to:

$$L_2(1-q^{-0.4})i^{0.6}.$$

The effective lengths depend on the width of the current bundles crossing the zones I1 and I2. By simply providing spaced apart N+ spans, the current bundles are substantially trapezoidal, as shown by dashed arrows in FIG. 6B. To increase the difference between the effective lengths in zones I1 and I2, a trench insulator 60 may be provided between zones I1 and I2 along the axis of the waveguide. The insulator 60 is open opposite the N+ spans, substantially over the same length as the spans. This reduces the average width of the current bundles in zone I1 by straightening them out.

Figure 1:
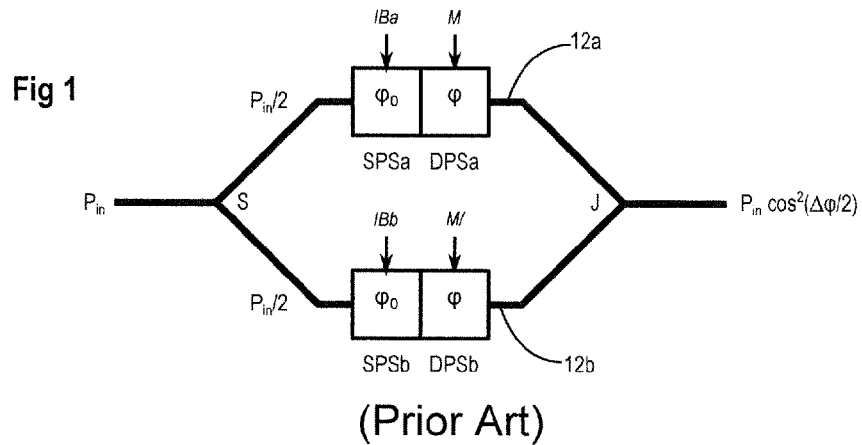
FIG. 1 is a schematic diagram of an optical modulator according to the Mach-Zehnder interferometer principle (MZI) as in the prior art.
Figure 2:
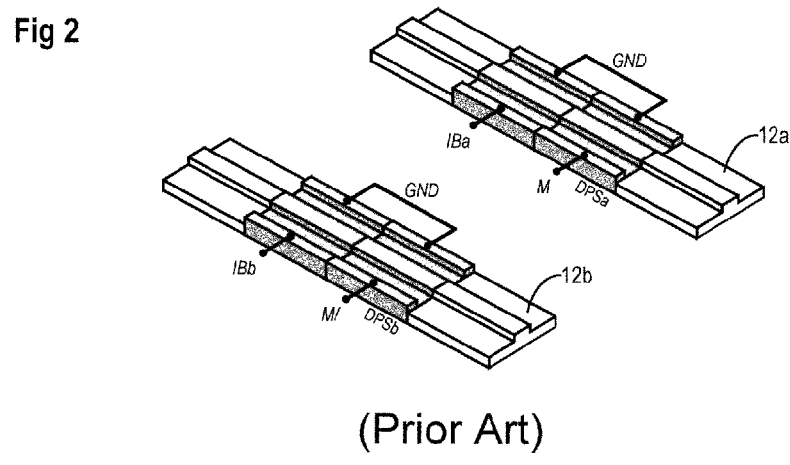
FIG. 2 is a schematic diagram of a perspective view of two branches of the modulator of FIG. 1.

In theory, a single static phase shifter SPS arranged in one of the branches 12a and 12b could suffice to obtain the desired quiescent phase shift between the two branches. In practice, as shown in the figures, a static phase shifter is provided in each branch. This helps equalize the optical paths of the two branches. In addition, in the configurations of FIGS. 1 and 2, each of the two static phase shifters may be controlled by a non-zero current (IAb, IBb). Indeed, this provides a more linear response of the phase shift introduced by the pair of static phase shifters to a variation of the difference between the control signals. This effect is also obtained in the dual static phase shifter of FIGS. 6A and 6B, since the control current, even if it is single-ended, offsets the two optical zones I1 and I2 from their zero current operating conditions.

FIGS. 7A and 7B show a second embodiment of a dual static phase shifter. The phase shifter includes two PIN junction shifters in opposition, sharing a contact area, here the P+ zone bearing an anode contact A. Each of the intrinsic regions I1, I2 of the two PIN phase shifters is associated with one of the waveguide branches 12a, 12b. The lateral N+ regions bear respective cathode contacts Ca, Cb.

According to the sectional view of FIG. 7A, such a structure would suffice to independently adjust the static phase shift in each of the branches 12a and 12b, by applying separate control currents between terminal A and each of terminals Ca and Cb. However, to simplify the control of the dual phase shifter, a single control current may be used. The cathode contacts Ca and Cb are then electrically connected to each other (by a metal track not shown) so that the control current is distributed between the anode A and each of the cathode contacts Ca and Cb. In this case, without taking further design measures, the optical phase shift introduced by each of the zones I1 and I2 would be the same.

FIG. 7B illustrates, more specifically, a structure for creating an imbalance in the way the single control current is distributed, and thus for creating a phase shift between the two optical waves that increases with the control current. One of the lateral regions, here the left region, has a continuous doping level along the axis of the waveguides, while the opposite lateral region, the region on the right, has a discontinuous doping level along the same axis. Thus, the right region includes spaced apart N+ doped spans. As a result, the zone I2 has a similar optical action to that of a typical PIN junction phase shifter, while the zone I1, as shown in FIG. 6B, has a modified optical action depending on the width of the current bundles directed from the central area to the N+ spans. The N+ spans are electrically connected to the same control terminal Ca, for example, by way of comb-shaped metal tracks similar to those of FIG. 5.

To reduce the width of the current bundles in region I1, a trench insulator 70 may be provided along the right wall of the P+ zone, playing a similar role as the insulator 60 of FIG. 6B. The insulator 70 is open opposite the N+ spans, over substantially the same length as the spans. To avoid a dispersion of the current paths in zone I1, insulating walls 72 may be provided, shown in dashed lines, located between the N+ spans perpendicular to the axis of the waveguide. These walls, in order to prevent optical interference, may be made of intrinsic undoped silicon (whereas the so-called intrinsic zone of PIN junction phase shifters is generally lightly P-doped).

This structure achieves a phase shift between the two branches, in a first approximation, according to the same equations as the structure of FIGS. 6A and 6B. However, because zone I1 has a greater resistivity than zone I2, due to the fragmentation of spans N+, the control current penetrating through the central anode A may tend to go through the less resistive zone I2. This increases the refractive index of zone I2 to the detriment of zone I1 and thus the sensitivity of the phase shifter is increased.

According to an alternative embodiment, to unbalance the current distribution in the zones I1 and I2, the widths of zones I1 and I2 may be changed. For example, as shown in dashed lines, the zone I2 may be made narrower than zone I1 by extending each of the N+ and P+ zones into zone I2. The refractive index of zone I2, for a given current, is inversely proportional to the width. Where $w_1$ and $w_2$ are the widths of the zones I1 and I2, respectively, the phase difference between the branches is proportional to $1/w_2 - 1/w_1$.

In addition, the resistivity of the junction is proportional to the width. Therefore, the control current may tend to go into the narrower zone I2, which increases the refractive index of zone I2 to the detriment of zone I1, and thus the sensitivity of the phase shifter is increased. Of course, the technique of fragmenting the spans N+ in zone I1 and the technique of narrowing the zone I2 may be combined to further increase the sensitivity of the dual phase shifter.

That which is claimed is:

1. A semiconductor electro-optical phase shifter comprising:
   a central zone;
   first and second lateral zones flanking said central zone along a first axis and having respectively first and second conductivity types so as to form a diode junction between said first and second lateral zones;
   said central zone comprises first and second optical action zones being separated along the first axis;
   said first lateral zone being doped continuously along a second axis perpendicular to the first axis; and
   said second lateral zone being doped discontinuously along the second axis perpendicular to the first axis; and
   first and second control terminals, said first control terminal being coupled to said first lateral zone, said second control terminal being coupled to doped portions of said second lateral zone.

2. The semiconductor electro-optical phase shifter according to claim 1 wherein said central zone has a minimum dopant concentration.

3. The semiconductor electro-optical phase shifter according to claim 1 further comprising an insulator between said first and second optical action zones and being open opposite the doped portions of said second lateral zone.

4. The semiconductor electro-optical phase shifter according to claim 1 further comprising first and second optical waveguides; wherein said first and second optical action zones are respectively aligned with said first and second optical waveguides; and wherein a distance between said first and second optical action zones is configured to prevent an optical coupling between said first and second optical waveguides.

5. A Mach-Zehnder interferometer electro-optical modulator comprising:
   first and second optical waveguides comprising semiconductor material and being spaced apart at a distance to prevent optical coupling;
   an optical beam splitter configured to feed each of said first and second optical waveguides from a single input beam;
   a phase shifter comprising
      a central zone,
      first and second lateral zones flanking said central zone along a first axis and having respectively first and second conductivity types so as to form a first diode junction between said first and second lateral zones,
      said central zone comprising first and second optical action zones being separated along the first axis,
      said first lateral zone being doped continuously along a second axis perpendicular to the first axis,
      said second lateral zone being doped discontinuously along the second axis perpendicular to the first axis, and
      first and second control terminals, said first control terminal being coupled to said first lateral zone, said second control terminal being coupled to doped portions of said second lateral zone; and
   a junction configured to combine first and second optical beams exiting said phase shifter.

6. The Mach-Zehnder interferometer electro-optical modulator according to claim 5 wherein said central zone has a minimum dopant concentration.

7. The Mach-Zehnder interferometer electro-optical modulator according to claim 5 further comprising:

a dual dynamic phase shifter aligned with said first and second optical waveguides and comprising
an intermediate zone having the first conductivity type,
a third lateral zone having the second conductivity type,
a third optical action zone adjacent a second diode junction formed between said intermediate zone and said third lateral zone,
a fourth lateral zone opposite said third lateral zone and having the second conductivity type,
a fourth optical action zone adjacent a third diode junction formed between said intermediate zone and said fourth lateral zone, and
third and fourth control terminals coupled with said third and fourth lateral zones, respectively.

8. The Mach-Zehnder interferometer electro-optical modulator according to claim 5 wherein said phase shifter comprises an insulator between said first and second optical action zones and being open opposite the doped portions of said second lateral zone.

9. A method for making a semiconductor electro-optical phase shifter, the method comprising:
forming a central zone;
forming first and second lateral zones flanking the central zone along a first axis and having respectively first and second conductivity types so as to form a diode junction between the first and second lateral zones, the central zone comprising first and second optical action zones being separated along the first axis;
the first lateral zone being doped continuously along a second axis perpendicular to the first axis, the second lateral zone being doped discontinuously along the second axis perpendicular to the first axis; and
forming first and second control terminals, the first control terminal being coupled to the first lateral zone, the second control terminal being coupled to doped portions of the second lateral zone.

10. The method according to claim 9 wherein the central zone has a minimum dopant concentration.

11. The method according to claim 9 further comprising forming an insulator between the first and second optical action zones and being open opposite the doped portions of the second lateral zone.

12. The method according to claim 9 further comprising forming first and second optical waveguides; wherein the first and second optical action zones are respectively aligned with the first and second optical waveguides; and wherein a distance between the first and second optical action zones is configured to prevent an optical coupling between the first and second optical waveguides.

* * * * *